Oct. 20, 1970 B. SACHS ET AL 3,534,467

METHOD OF PRODUCING A SEMICONDUCTOR STRUCTURAL COMPONENT INCLUDING A GALVANOMAGNETICALLY RESISTIVE SEMICONDUCTOR CRYSTAL

Filed Oct. 24, 1967

United States Patent Office
3,534,467
Patented Oct. 20, 1970

3,534,467

METHOD OF PRODUCING A SEMICONDUCTOR STRUCTURAL COMPONENT INCLUDING A GALVANOMAGNETICALLY RESISTIVE SEMICONDUCTOR CRYSTAL

Bertram Sachs, Erlangen-Buchenbach, and Adolf Albrecht, Erlangen, Germany, assignors to Siemens Aktiengesellschaft, Berlin and Munich, Germany, a corporation of Germany Filed Oct. 24, 1967, Ser. No. 677,649
Claims priority, application Germany, Oct. 28, 1966, S 106,756
Int. Cl. H01l 7/66
U.S. Cl. 29—583 16 Claims

ABSTRACT OF THE DISCLOSURE

A galvanomagnetically resistive substantially planar semiconductor crystal body having substantially parallel oriented inclusions of good electrical conductivity is supported on a substantially planar carrier plate. Part of the semiconductor body is removed to reduce the thickness thereof to between 5 and 50 microns. The semiconductor body is removed from the carrier plate. The semiconductor body is supported on a surface of a structural component. Electrical terminals are electrically connected to the semiconductor body.

DESCRIPTION OF THE INVENTION

The present invention relates to a method of producing a semiconductor structural component. More particularly, the invention relates to a method of producing a semiconductor structural component including a galvanomagnetically resistive semiconductor crystal.

The galvanomagnetically resistive semiconductor crystal has a plurality of electrically conductive inclusions either embedded therein or on a surface thereof and positioned in substantially parallel orientation with each other. The conductive inclusions may comprise needles, strips or the like. The semiconductor crystal or body may comprise any suitable $A_{III}B_{V}$ compound composed of elements of the III and V group of the periodic system such as, for example, indium antimonide, indium arsenide, indium phosphide, gallium phosphide, germanium and silicon. The conductor material is suitable for use as a galvanomagnetic resistance or field plate and the electrically conducting, substantially parallel oriented inclusions in the semiconductor body are produced during the solidification of the semiconductor melt. The electrically conductive inclusions may comprise, for example, nickel antimonide needles embedded in an indium antimonide semiconductor body.

Semiconductor bodies of the type utilized are described, for example, in Z. Physik, 176, pages 399–408 (1963) and in U.S. Pat. No. 3,226,225. When the semiconductor structural component is utilized as a galvanomagnetic resistor, the conductive parallel inclusions or strips may be placed upon a surface of the semiconductor body. This is called a raster plate and is described in a periodical entitled ETZ-A 76, Aug. 1, 1955, pages 513, 517 and in the U.S. Pat. No. 2,894,234.

In the methods of the prior art, field plates of both types were often positioned on an intermediate carrier called the carrier plate, which was a component of the field plate. Frequently, the field plate was positioned in the air gap of a magnet. The magnetic induction was sharply reduced at an increased width of the air gap. It was therefore necessary to attempt to make the semiconductor body and the carrier plate as thin as possible. However, the field plates were still too great in thickness and the production of the carrier plates entailed considerable expense. The carrier plates must have sufficient stability to prevent their damage during grinding or etching of the semiconductor body or layer. Since the field plates require such stability, they were inflexible and could therefore be utilized only on planar surfaces.

The principal object of the present invention is to provide a new and improved method of producing a semiconductor structural component including a galvanomagnetically resistive semiconductor crystal. The method of the present invention overcomes the disadvantages of the methods of the prior art.

The method of the present invention provides a semiconductor crystal or body which is flexible or pliable and which may therefore be bent into a desired configuration and may therefore be supported on a surface which is of any desired configuration and which need not be planar. The method of the present invention is also inexpensive since it does not utilize expensive carrier plates. The method of the present invention is efficient, effective and reliable. The method of the present invention involves simple steps.

In accordance with the present invention, a method of producing a semiconductor structural component including a galvanomagnetically resistive semiconductor crystal having substantially parallel oriented inclusions of good electrical conductivity, comprises supporting a galvanomagnetically resistive substantially planar semiconductor crystal body on a substantially planar carrier plate. Part of the semiconductor body is removed to reduce the thickness thereof to between 1 and 100 microns and preferably between 5 and 50 microns, particularly less than 20 microns. The semiconductor body is removed from the carrier plate. The semiconductor body is supported on a surface of the structural component. Electrical terminals are electrically connected to the semiconductor body.

The galvanomagnetically resistive semiconductor crystal has substantially parallel oriented inclusions of good electrical conductivity embedded therein or on a surface thereof. The part of the semiconductor body is removed by grinding or by etching until the remaining semiconductor body has a predetermined characteristic. The semiconductor body is supported on the carrier plate by cement affixing the semiconductor body to the carrier plate and the semiconductor plate is removed from the carrier plate by rinsing with a solvent for the cement. The layer of cement is between 1 and 2 microns in thickness and is soluble at room temperatures. The cement is a bubble-free layer of low-viscosity capillary adhesive of between 1 and 2 microns in thickness which penetrates into the semiconductor body and into the carrier plate and hardens upon a withdrawal of oxygen, the semiconductor body being free from adverse reaction with the adhesive, and the adhesive being resistant to etchants and lubricants and soluble in a residue-free manner in a solvent.

The structural component may be of flexible material. The surface of the structural component on which the semiconductor is supported may be arcuate. The semiconductor body may be supported so that only part of the semiconductor body is supported on the surface of the structural component and the remainder of the semiconductor body extends freely into space. The electrical terminals may be electrically connected to the semiconductor body at the same time that the semiconductor body is supported on the structural component. Part of the semiconductor body may be supported on the surface of the structural component by metallizing the surface, placing the part of the semiconductor body on the metallized surface of the structural component and heating the metallized surface at the area of contact of the semiconductor body and the metallized surface, the remainder of the semiconductor body extending freely into space. Electrically conductive bridges may be provided between parts of the semiconductor body and the metallized surface by vapor deposition of electrically conductive material between the parts of the semiconductor body and the metallized surface.

Field plates produced by the method of the present invention may be supported on a structural component surface of any suitable configuration, which may be curved, such as, for example, the pole shoe of a magnet. This permits the reduction of the width of the air gap from the previous magnitude of 200 microns in field plates of the prior art to a magnitude of less than 100 microns and, more specifically, to a magnitude of 40 microns and less. Furthermore, it is of considerable advantage that the semiconductor bodies produced by the method of the present invention are flexible or pliable, since this enables the surface of the structural component which supports the semiconductor body to be flexible or pliable itself. Also, the very small thickness of the field plate produced by the method of the present invention permits rapid dissipation of heat, thereby avoiding damage to the semiconductor body. An embodiment of a structural component utilizing the field plate produced by the method of the present invention, in which only part of the semiconductor body is supported on a surface of the structural component and the remainder of the semiconductor body extends freely into space, is especially suitable for measuring or indicating magnetic fields in liquefied or diluted gases, such as, for example, helium.

In order that the present invention may be readily carried out into effect it will now be described with reference to the accompanying drawings wherein.

The object of the present invention is to provide a semiconductor crystal body or layer which is as thin as possible. The semiconductor material has a relatively small permeability for electromagnetic waves such as, for example, infrared light. The semiconductor material may be utilized as a filter, therefore, despite its polarization effect which is caused primarily by the inclusions of good electrically conductive material. Semiconductor crystals such as, for example, indium antimonide or indium phosphide cannot be ground as thin as desired without a supporting base. The method of the present invention is therefore suitable for producing polarizing filters of the type described, for example, in "Solid State Electronics," Pergamon Press, 1964, vol. 7, pp. 835–841.

Figure 1:
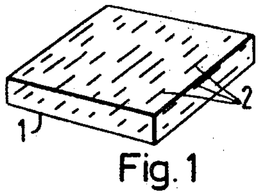
FIG. 1 is a perspective view of a semiconductor body having inclusions of good conductivity embedded therein, which body may be utilized in the method of the present invention.

In FIG. 1, the semiconductor body 1 includes a plurality of embedded needle inclusions 2. The needle inclusions are oriented in parallel relation to each other and comprise good electrically conductive material.

Figure 2:
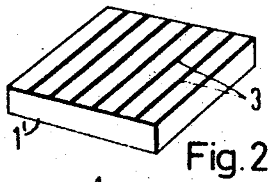
FIG. 2 is a perspective view of a semiconductor body having strips of good electrical conductivity on a surface thereof, which body may be utilized in the method of present invention.

In FIG. 2, the semiconductor body 1' includes a plurality of parallel strips 3 embedded in one surface thereof. The parallel strips 3 comprise material of good electrical conductivity.

Figure 3:
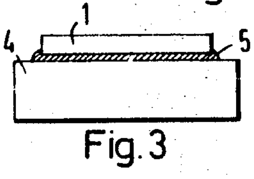
FIGS. 3, 4 and 5 are schematic views of the components utilized during the method of the present invention, FIGS. 3 and 4 being sectional views and FIG. 5 being a perspective view.

In FIG. 3, the semiconductor body 1, which may be either the semiconductor body 1 of FIG. 1 or the semiconductor body 1' of FIG. 2, is supported on or affixed to a carrier plate 4 by means of a cold-soluble cement or adhesive 5.

The semiconductor body is a galvanomagnetically resistive semiconductor crystal of substantially planar configuration and the carrrier plate 4 is of substantially planar configuration. The exposed surface of the semiconductor body or layer 1 is ground, etched and/or polished in order to remove part of the semiconductor material to reduce the thickness thereof. The grinding or etching operation is continued until the thickness of the semiconductor body 1 is between 1 and 100 microns, and is preferably between 5 and 50 microns, particularly less than 20 microns. The carrier plate 4 may comprise a polished plate of glass or ceramic material, for example. A plurality of semiconductor layers 1 may be produced at the same time in the method of the present invention.

Figure 4:
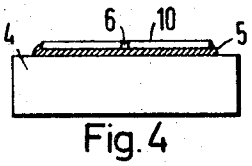

The semiconductor body or layer 1, after grinding or etching, becomes the considerably thinner semiconductor body or layer 10, as indicated in FIG. 4. In FIG. 4, the semiconductor body 10 is still affixed to the carrier plate 4 by the cement or adhesive 5. An elongated cutout 6 is provided in the semiconductor body 10. The cement or adhesive 5 has a thickness of between 1 and 2 microns and is soluble in a solvent at temperatures which are non-damaging to the semiconductor body 10, such as, for example, room temperatures. The cement or adhesive may comprise a bubble-free layer of low viscosity capillary adhesive of between 1 and 2 microns in thickness which has a viscosity and composition such that it penetrates into the semiconductor body 1 and into the carrier plate 4 and hardens upon a withdrawal of oxygen therefrom. Suitable low viscosity adhesives or cements are, for example, Isamet, Monoment, Sicomet. The adhesive or cement 5 does not react adversely or adversely dope the semiconductor body 10, and separates from said semiconductor body without residue in a solvent. The adhesive or cement 5 is chemically soluble when cold and is resistant to etchants and lubricants.

The semiconductor layer 10 preferably has a thickness of less than 20 microns, so that, in itself, it is flexible or pliable. The semiconductor layer 10 may be further etched or suitably treated until the remaining semiconductor layer has a predetermined characteristic such as a specific electrical resistance value or surface quality. If desired, any suitable configuration, including a regular or irregular configuration, may be etched into the semiconductor body 10. Any suitable technique such as, for example, a masking technique, may be utilized.

Figure 5:
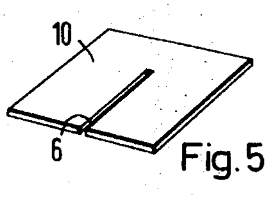

As indicated in FIG. 5, which shows the elongated cutout 6, semiconductor body 10 is removed, after the desired reduction of its thickness, from the carrier plate 4. This is accomplished by the dissolving of the cement or adhesive 5 in a suitable solvent at room temperatures. The chemical solvent enables the semiconductor body 10 to be rinsed away from the carrier plate 4 on, for example, nylon hose. The semiconductor body 10 may be picked up by a moist brush such as, for example, a paint brush or similar device. The removed semiconductor body is then supported on a surface of a structural component.

Figure 6:
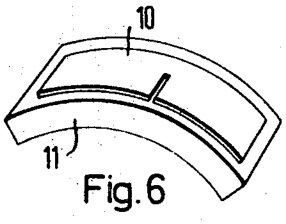
FIG. 6 is a perspective view of an embodiment of a structural component utilized in the method of the present invention with the semiconductor body supported thereon.

As indicated in FIG. 6 and thereafter, the separated semiconductor body 10 may be supported on or affixed to a predetermined surface of a selected structural component. The semiconductor body 10 may be affixed to the surface of the structural component by a suitable cement, if desired, such as for example, Araldite.

The galvanomagnetic flexible semiconductor body 10 is provided with electrical terminals which are electrically connected thereto simultaneously with the application of said semiconductor body to the structural component, or thereafter. The electrical terminals may be provided by metallizing the surface of the structural component at the areas of contact with the semiconductor body. The metallization may utilize, for example, indiumized copper. The metallized surface areas of the structural component enable simultaneous electrical contact and connection between the semiconductor body and the metallized surface areas by placing the appropriate part of said metallized surface area and heating said metallized surface area. The heating may be accomplished by radiated heat.

In FIG. 6, the flexible semiconductor body 10 is affixed to the arcuate surface of a plate 11 of arcuate configuration.

Figure 7:
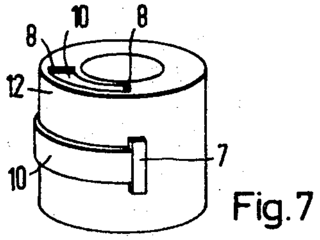
FIG. 7 is a perspective view of another embodiment of a structural component of the method of the present invention with semiconductor bodies supported thereon.

In FIG. 7, one flexible semiconductor body 10 is affixed to the cylindrical surface of a hollow cylinder 12 and includes electrical terminals 7. Another flexible semiconductor body 10 is affixed to an annular substantially planar base of the hollow cylinder 12 and includes electrical terminals 8.

Figure 8:
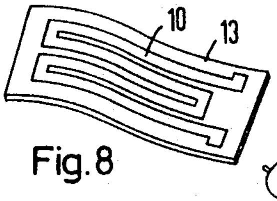
FIG. 8 is a perspective view of another embodiment of the structural component of the method of the present invention with a semiconductor body supported thereon.

In FIG. 8, the flexible semiconductor body is provided in an elongated, substantially M-shaped configuration and is affixed to a flexible or pliable tape, foil or the like 13. The tape or foil 13 may be positioned with facility in the arcuate air gap of a magnetic circuit.

Figure 9:
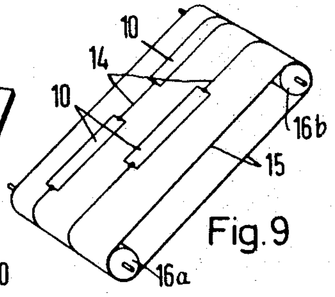
FIG. 9 is a perspective view of another embodiment of the structural component of the method of the present invention with semiconductor bodies supported thereon.

In FIG. 9, a plurality of flexible semiconductor bodies 10 are affixed to an endless tape or band 15. The various semiconductor bodies 10 are electrically connected to each other via electrical conductors 14 which may be integrally formed with the tape or band 15. The band 15 is continuously driven and supported by a pair of spaced rollers **16*a* and 16*b***.

Figure 10:
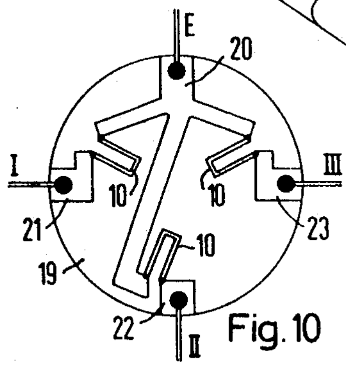
FIG. 10 is a view of a structural component of the method of the present invention with semiconductor bodies supported thereon.
Figure 11:
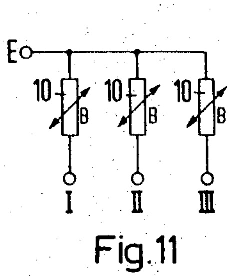
FIG. 11 is a schematic circuit diagram of the embodiment of FIG. 10.

In FIG. 10, a plurality of semiconductor bodies 10 of substantially U-shaped configuration are affixed to a board 19 of a printed circuit, the circuit diagram of which is shown in FIG. 11. An electrical terminal E of the flexible board 19 is electrically connected via electrically conductive strip 20 to one end of each of the three semiconductor bodies 10. The other end of one of the semiconductor bodies 10 is electrically connected to an electrical output terminal I via an electrically conductive strip 21. The other end of the second semiconductor body 10 is electrically connected to an output terminal II via an electrically conductive strip 22. The other end of the third semiconductor body 10 is electrically connected to an electrical output terminal III via an electrically conductive strip 23.

The printed circuit of FIGS. 10 and 11 thus includes three galvanomagnetic resistances 10 symmetrically positioned on the flexible board 19 and is therefore suitable for use, for example, as switching head in a commutating electrical machine.

Figure 12:
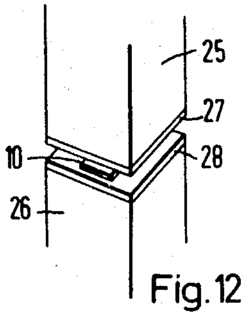
FIG. 12 is a perspective view of another embodiment of the structural component of the method of the present invention with a semiconductor body supported thereon.

In FIG. 12, the galvanomagnetic resistance or semiconductor body 10 is positioned between the pole shoes 25 and 26 of a magnet. The pole shoes are indicated as rectangular parallelepipeds for the purpose of simplicity of illustration. The semiconductor body 10 may be electrically insulated from the pole shoes 25 and 26 by layers 27 and 28 of electrical insulation. The insulating layers 27 and 28 may comprise, for example, a synthetic material or cement. In an operative embodiment of FIG. 12, the air gap between the pole shoes 25 and 26 was less than 40 microns in width and the insulating layers 27 and 28 had a voltage stability in excess of 1000 volts.

Figure 13:
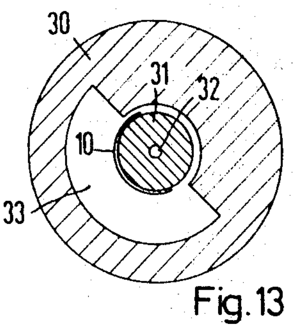
FIG. 13 is a sectional view of another embodiment of the structural component of the method of the present invention with a semiconductor body supported thereon.

FIG. 13, the semiconductor body 10 is affixed to the cylindircal surface of a radially magnetized pole shoe 31 in an arcuate circuit. The pole shoe 31 is rotatable about an axis 32 and is coaxially positioned with and within a radially magnetized pole shoe 30. The pole shoes 30 and 31 are rotatable about the axis 32. The air gap between the pole shoes 30 and 31 is considerably wider in an area 33, which is approximately half the circumferential extension of the air gap, then it is in the remaining half of its circumferential extension.

In FIG. 13, when the galvanomagnetic resistance 10 is in the wider air gap 33, it is substantially free from the magnetic field. When the galvanomagnetic resistance 10 is in the narrower air gap, it is in a strong magnetic field. The galvanomagnetic resistance 10 in the embodiment of FIG. 13 is flexible or pliable to the extent that it may be affixed to the cylindrical surface of the pole shoe 31 when the radius of curvature is approximately 7 mm.

Figure 14:
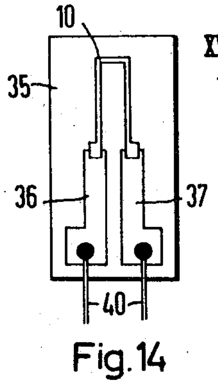
FIG. 14 is a view of still another embodiment of a structural component of the method of the present invention with a semiconductor body supported thereon.

In FIG. 14, the semiconductor body 10 is affixed to electrically conductive strips 36 and 37 of a structural component 35. An electrical terminal 40 is electrically connected to the electrically conductive strip 36 and an electrical terminal 41 is electrically connected to the electrically conductive strip 37. The semiconductor body may be affixed to the electrically conductive strips 36 and 37 by any suitable means, such as for example, solder.

Figure 15:
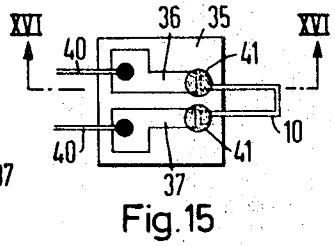
FIG. 15 is a view of a modification of the embodiment of FIG. 14.
Figure 16:
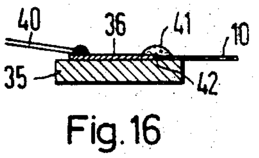
FIG. 16 is a sectional view taken along the lines XVI—XVI of FIG. 15.

In FIGS. 15 and 16 which illustrate a modification of FIG. 14, the same structural component 35 is utilized and the same electrically conductive strips 36 and 37 are provided thereon. The same electrical terminals 40 and 41 are electrically connected to the electrically conductive strips 36 and 37, respectively. However, only the free ends of the substantially U-shaped semiconductor body 10 are affixed to the electrically conductive strips 36 and 37, so that the remainder of said semiconductor body extends freely into space. The free ends of the semiconductor body 10 can be affixed to the corresponding electrically conductive strips 36 and 37 by any suitable means 42 and 43, respectively. In each of FIGS. 10, 14, 15 and 16, the electrically conductive strips are preferably metallized surface areas of the structural component, as hereinbefore described.

In FIGS. 15 and 16, a good electrically conducting material such as, for example, silver or aluminum may be deposited by vapor deposition at the junction of the free ends of the semiconductor body 10 and the electrically conductive strips 36 and 37 to provide electrically conductive bridges 42 and 43, respectively.

A masking method is concurrently utilized to limit the electrically conductive bridge to the desired area. Thus, an electrically conductive bridge 42 provides an electrical and physical connection between one free end of the semiconductor body 10 and the electrically conductive strip 36, and an electrically conductive bridge 43 provides an electrical and physical connection between the other free end of said semiconductor body 10 and the electrically conductive strip 37. The vapor deposition bridging method is preferred since it eliminates the requirement for heating in order to provide electrical connection between the semiconductor body 10 and the electrically conductive strips 36 and 37.

A small amount of cement or adhesive 44 (FIG. 16) may be provided between the free ends of the semiconductor body 10 and the corresponding electrically conductive strips 36 and 37, in order to fill in any spaces or gaps therebetween.

While the invention has been described by means of specifical examples and in specific embodiments, we do not wish to be limited thereto, for obvious modifications will occur to those skilled in the art without departing from the spirit and scope of the invention.

We claim:

1. A method of producing a semiconductor structural component including a galvanomagnetically resistive semiconductor crystal having substantially parallel oriented inclusions of good electrical conductivity, comprising the steps of supporting a galvanomagnetically resistive substantially planar semiconductor crystal body on a substantially planar carrier plate;
removing part of the semiconductor body to reduce the thickness thereof to between 1 and 100 microns;
removing the semiconductor body from the carrier plate; and
electrically connecting electrical terminals to the semiconductor body.

2. A method as claimed in claim 1, wherein said galvanomagnetically resistive semiconductor crystal has substantially parallel oriented inclusions of good electrical conductivity embedded therein.

3. A method as claimed in claim 1, wherein said galvanomegnetically resistive semiconductor crystal has substantially parallel oriented inclusions of good electrical conductivity on a surface thereof.

4. A method as claimed in claim 1, wherein said part of said semiconductor body is removed by grinding.

5. A method as claimed in claim 1, wherein said part of said semiconductor body is removed by etching until the remaining semiconductor body has a predetermined characteristic.

6. A method as claimed in claim 1, wherein said semiconductor body is supported on said carrier plate by cement affixing said semiconductor body to said carrier plate and said semiconductor plate is removed from said carrier plate by rinsing with a solvent for said cement.

7. A method as claimed in claim 1, wherein said semiconductor body is supported on said carrier plate by a layer of cement of between 1 and 2 microns in thickness which is soluble at room temperatures.

8. A method as claimed in claim 1, wherein said semiconductor body is supported on said carrier plate by a bubble-free layer of low viscosity capillary adhesive of between 1 and 2 microns in thickness which penetrates into said semiconductor body and into said carrier plate and hardens upon a withdrawal of oxygen, said semiconductor body being free from adverse reaction with said adhesive, and said adhesive being resistant to etchants and lubricants and soluble in a residue-free manner in a solvent.

9. A method as claimed in claim 1, further comprising supporting the semiconductor body on a surface of a structural component after removal from the carrier plate, said structural component being of flexible material.

10. A method as claimed in claim 9, wherein the surface of said structural component on which said semiconductor body is supported is arcuate.

11. A method as claimed in claim 9, wherein only part of said semiconductor body is supported on the surface of said structural component and the remainder of said semiconductor body extends freely into space.

12. A method as claimed in claim 9, wherein said electrical terminals are electrically connected to said semiconductor body at the same time that said semiconductor body is supported on said structural component.

13. A method of producing a semiconductor structural component including a galvanomagnetically resistive semiconductor crystal having substantially parallel oriented inclusions of good electrical conductivity, comprising the steps of supporting a galvanomagnetically resistive substantially planar semiconductor crystal body on a substantially planar carrier plate;
removing part of the semiconductor body to reduce the thickness thereof to between 5 and 50 microns;
removing the semiconductor body from the carrier plate;
metallizing a surface of the structural component;
placing part of the semiconductor body on the metallized surface of the structural component;
heating the metallized surface at the area of contact of the semiconductor body and the metallized surface, the remainder of the semiconductor body extending freely into space; and
electrically connecting electrical terminals to the semiconductor body.

14. A method as claimed in claim 13, further comprising providing electrically conductive bridges between parts of said semiconductor body and said metallized surface by vapor deposition of electrically conductive material between said parts of said semiconductor body and said metallized surface.

15. A method as claimed in claim 1, wherein part of the semiconductor body is removed to reduce the thickness thereof to between 5 and 50 microns.

16. A method as claimed in claim 1, wherein part of the semiconductor body is removed to reduce the thickness thereof to less than 20 microns.

References Cited

UNITED STATES PATENTS

| | | | |
|---|---|---|---|
| 2,884,508 | 4/1959 | Czipott et al. | |
| 2,984,897 | 5/1961 | Godfrey | 29—424 |
| 3,152,939 | 10/1964 | Borneman et al. | 29—423 X |
| 3,247,579 | 4/1966 | Cattermole et al. | 29—423 X |
| 3,261,074 | 7/1966 | Beauzée | 29—572 |
| 3,343,255 | 9/1967 | Donovan | 29—423 X |
| 3,365,794 | 1/1968 | Botka | 29—572 |

PAUL M. COHEN, Primary Examiner

U.S. Cl. X.R.

29—423, 572, 580, 620; 317—234